United States Patent
Wu et al.

[11] Patent Number: 6,057,248
[45] Date of Patent: *May 2, 2000

[54] METHOD OF REMOVING RESIDUAL CONTAMINANTS IN AN ALIGNMENT MARK AFTER A CMP PROCESS

[75] Inventors: Kun-Lin Wu, Taichung; Horng-Bor Lu, Hsinchu, both of Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/897,282

[22] Filed: Jul. 21, 1997

[51] Int. Cl.$^7$ .............................................. H01L 21/4763

[52] U.S. Cl. ......................................... 438/745; 438/692

[58] Field of Search ................................. 438/396, 633, 438/692, 748; 510/175

[56] References Cited

U.S. PATENT DOCUMENTS 5,271,798  12/1993  Sandhu et al. ........................... 156/638
5,789,360   8/1998  Song et al. .............................. 510/175

Primary Examiner—David Nelms
Assistant Examiner—Renee' R. Berry
Attorney, Agent, or Firm—Knobbe, Martens, Olson & Bear, LLP

[57] ABSTRACT

A method of removing residual contaminants in grooves of an alignment mark of a semiconductor wafer after a chemical-mechanical polishing is disclosed. The method includes scrubbing the semiconductor wafer using conventional scrubbing technique. Next, the semiconductor wafer is etched back to remove a damaged layer, which is formed during the chemical-mechanical polishing, over the semiconductor wafer. Finally, the semiconductor wafer is cleaned, for example, by $NH_4OH/H_2O_2/DI$, agitated by a megasonic source, thereby substantially removing the residual contaminants from the alignment mark.

8 Claims, 1 Drawing Sheet

METHOD OF REMOVING RESIDUAL CONTAMINANTS IN AN ALIGNMENT MARK AFTER A CMP PROCESS

BACKGROUND OF THE INVENTION

1. Field of the Invention

The present invention relates to a method of removing residual particles, and particularly to a method of removing residual contaminants in grooves of an alignment mark of a semiconductor wafer after a chemical-mechanical polishing.

2. Description of the Prior Art

The handling during semiconductor fabricating processes, such as cutting, lapping, polishing, or packaging, generally results in large amounts of contamination, wherein much of the origin of the contamination is not well understood. The front part of fabricating very large scale integration (VLSI) circuits, such as forming gates or field oxides, generally requires stringent cleanness, wherein removal of the contaminants is usually done by rinsing in hot organic solvents, accompanied by ultrasonic agitation with power of about 1000 watt during wafer cleaning. However, the rear part of fabricating VLSI circuits, such as planarization or metallization, has a less stringent standard in cleaning. Unfortunately, some of the slurry used in a chemical-mechanical polishing (CMP) step remains over the wafer, especially in the grooves of alignment marks for lighography purpose. FIG. 1 shows a cross-sectional view of an alignment mark 10, wherein some particles 12 reside inside the grooves 14 of the alignment mark 10. These particles 12 disadvantageously make the positioning of photo masks during lithography step difficult. The residual particles 12 generated after CMP are conventionally removed by a scrubber apparatus. Unfortunately, only a portion of the particles 12 can be removed by the conventional method. Furthermore, even the cleaning procedure used in the front part of the fabrication can not apply to solve this problem due to, for example, the insuitability of the solvents for removing the particles inside the alignment marks, or due to the unwillingness of using those apparatus to remove the particles after CMP in being afraid of contaminating this apparatus by the rear part of the fabrication. There is, therefore, a need of inventing a procedure for removing residual slurry or particles in the alignment marks after CMP.

SUMMARY OF THE INVENTION

In accordance with the present invention, a method is provided for removing residual contaminants in grooves of an alignment mark of a semiconductor wafer after a chemical-mechanical polishing, thereby substantially removing the contaminants such as the residual particles from the slurry and the polishing pads. In one embodiment, the semiconductor wafer is firstly scrubbed using conventional scrubbing technique. Next, the semiconductor wafer is dipped in a HF solution to remove a damaged layer over the semiconductor wafer, wherein the damaged layer is formed during the chemical-mechanical polishing. Finally, the semiconductor wafer is cleaned, for example, by $NH_4OH/H_2O_2/DI$ agitated by a megasonic source, thereby removing the residual contaminants from the alignment mark. In this embodiment, the power of the megasonic source is about 10–2000 watt, and the concentration ratio of the $NH_4OH/H_2O_2/DI$ is about 1:1:5.

DESCRIPTION OF THE PREFERRED EMBODIMENT

Figure 1:
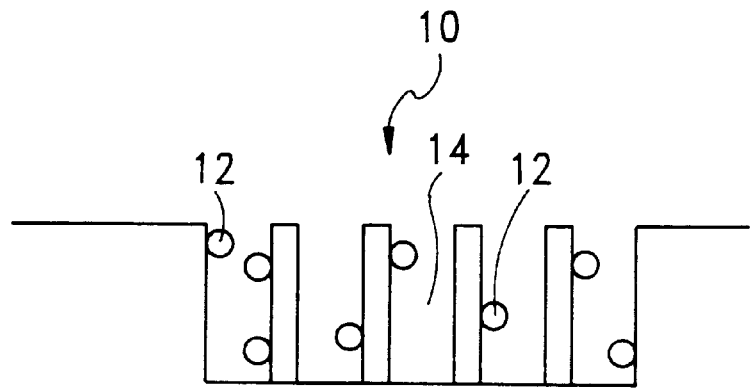
FIG. 1 shows a cross-sectional view of an alignment mark, wherein some particles reside inside the grooves of the alignment mark.
Figure 2:
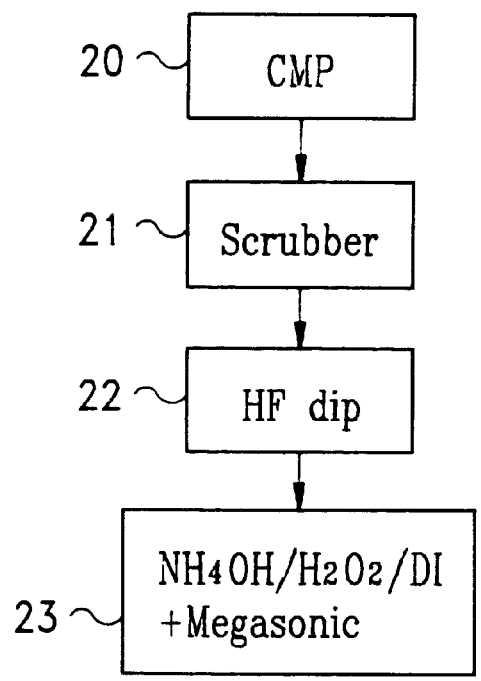
FIG. 2 shows a flow diagram illustrating a procedure for removing residual contaminants or slurry after performing a chemical-mechanical polishing (CMP) in accordance with an embodiment of the present invention.

FIG. 2 shows a flow diagram illustrating a procedure for removing residual contaminants or slurry after performing a chemical-mechanical polishing (CMP) in accordance with an embodiment of the present invention. A conventional CMP process is performed, in step 20, when a global planarization over an entire substrate is required. This process needs control of the temperature and pH of the polishing medium, so that a consistent removal rate can be achieved. An abrasive slurry in a solution with hydroxyl is commonly used in polishing silica material such as borophosphosilicate (BPSG), borosilicate glass (BSG), phosphosilicate (PSG), or undoped silicate glass (USG).

After the CMP process, a great number of residual particles from the slurry and the polishing pads are generated. These particles reside in the grooves of the alignment marks, therefore disadvantageously making the positioning of the photo masks during lighography step difficult. These contaminants are then removed using a conventional scrubber apparatus. During the scrubbing (step 21), the wafer under clean is firstly cleaned, for example, by double-side brushes, followed by rinsing in solvent such as $NH_4OH$. Usually, the wafer is subject to further rinsing by HF, followed by spin dry or lamp dry.

Although a great effort is done in step 21 to remove the residual particles in the alignment marks, a substantial number of the particles still resides therein. In the embodiment of the present invention, a step 22 may be performed to dip the wafer under clean to HF solution to etch back a thin layer that is damaged during CMP. In this embodiment, the HF solution having concentration of about 50:1–500:1 is used to etch the damaged layer in about 10 seconds to 10 minutes.

Finally, a cleaning procedure (step 23) is performed to substantially remove the contaminants resided inside the alignment marks. In this embodiment, a solution of $NH_4OH/H_2O_2$/deionized water (DI) (1:1:5) is used to perform the aforementioned function. It is appreciated that the concentration ratio in $NH_4OH/H_2O_2$/DI can be suitably adjusted. Further, an ultrasonic (or megasonic) power of about 10–2000 watt is applied during this step. It is noted that the level of the megasonic power is usually larger than that of the megasonic (or ultrasonic) used in conventional process, especially in the front part of fabricating VLSI circuits. The difference in power is resulted from the different use of the megasonic apparatus in cleaning the wafers, that is, these megasonic apparatuses in the front part and the rear part of the fabrication are used differently in removing different particles.

After the cleaning procedure in step 23 is performed, the residual particles in the grooves of the alignments are substantially removed. Other conventional process, such as spin dry or lamp dry may be used subsequently.

Although specific embodiments have been illustrated and described, it will be obvious to those skilled in the art that various modifications may be made without departing from the spirit which is intended to be limited solely by the appended claims.

What is claimed is:

1. A method of removing residual contaminants in grooves of an alignment mark of a semiconductor wafer after a chemical-mechanical polishing, said method comprising:

scrubbing the semiconductor wafer using scrubbing technique;

dipping the semiconductor wafer in a HF solution to etch back the semi-conductor wafer to remove a damaged layer over the semiconductor wafer, said damaged layer being formed during the chemical-mechanical polishing; and cleaning said semiconductor wafer by $NH_4OH/H_2O/DI$ agitated by a megasonic source, thereby removing the residual contaminants from the alignment mark.

2. The method according to claim 1, wherein said scrubbing the semiconductor wafer comprises the steps of:

brushing said semiconductor wafer;

rinsing said semiconductor wafer in a solvent; and drying said semiconductor wafer.

3. The method according to claim 2, wherein said solvent comprises $NH_4OH$.

4. The method according to claim 3, wherein said solvent comprises HF.

5. The method according to claim 2, wherein said semiconductor wafer is dried by spin dry.

6. The method accordion got claim 2, wherein said semiconductor wafer is dried by lamp dry.

7. The method according to claim 1, wherein power of said megasonic source is about 10–2000 watt.

8. A method of removing residual contaminants in grooves of an alignment mark of a semiconductor wafer after a chemical-mechanical polishing, said method comprising:

scrubbing the semiconductor wafer using scrubbing technique;

etching back the semiconductor wafer in a HF solution by using a process of dipping to remove a damaged layer over the semiconductor wafer, said damaged layer being formed during the chemical-mechanical polishing; and cleaning said semiconductor wafer by $NH_4OH/H_2O/DI$ agitated by a megasonic source, thereby removing the residual contaminants from the alignment mark, power of said megasonic source being about 10–2000 watt.

* * * * *

UNITED STATES PATENT AND TRADEMARK OFFICE
CERTIFICATE OF CORRECTION

PATENT NO. : 6,057,248
DATED : May 2, 2000
INVENTOR(S) : Wu et al.

Page 1 of 1

It is certified that error appears in the above-identified patent and that said Letters Patent is hereby corrected as shown below:

Claim 6,
Should read --
The method [accordion got] according to claim 2, wherein said semiconductor wafer is dried by lamp dry. --

Signed and Sealed this

Eighteenth Day of December, 2001

Attest:

Attesting Officer

JAMES E. ROGAN
*Director of the United States Patent and Trademark Office*